United States Patent
Hood, III et al.

(10) Patent No.: US 8,453,467 B2
(45) Date of Patent: Jun. 4, 2013

(54) HYBRID HEAT EXCHANGER

(75) Inventors: Charles D. Hood, III, Cedar Park, TX (US); Ioan Sauciuc, Phoenix, AZ (US); Mohammed Tantoush, Austin, TX (US)

(73) Assignee: Dell Products, LP, Round Rock, TX (US)

( * ) Notice: Subject to any disclaimer, the term of this patent is extended or adjusted under 35 U.S.C. 154(b) by 1519 days.

(21) Appl. No.: 11/580,671

(22) Filed: Oct. 13, 2006

(65) Prior Publication Data

US 2008/0087024 A1     Apr. 17, 2008

(51) Int. Cl.
*F25B 21/02* (2006.01)
*F25D 23/12* (2006.01)

(52) U.S. Cl.
USPC ............................................ 62/3.2; 62/259.2

(58) Field of Classification Search
USPC .................... 62/3.2, 332, 259.2, 3.7
See application file for complete search history.

(56) References Cited

U.S. PATENT DOCUMENTS

| | | | |
|---|---|---|---|
| 1,071,999 A | 9/1913 | Gilson | |
| 4,090,145 A | 5/1978 | Webb | |
| 4,546,408 A | 10/1985 | Rodseth et al. | |
| 4,893,316 A | 1/1990 | Janc et al. | |
| 5,754,412 A | 5/1998 | Clavin | |
| 5,987,893 A | 11/1999 | Schulz-Harder et al. | |
| 6,002,924 A | 12/1999 | Takano | |
| 6,038,128 A | 3/2000 | Hood, III et al. | |
| 6,058,009 A | 5/2000 | Hood, III et al. | |
| 6,125,035 A | 9/2000 | Hood, III et al. | |
| 6,226,178 B1 | 5/2001 | Broder et al. | |
| 6,341,490 B1 * | 1/2002 | Jones | 62/3.7 |
| 6,471,310 B2 | 10/2002 | Montagna | |
| 6,543,098 B2 | 4/2003 | Meyer et al. | |
| 6,549,410 B1 | 4/2003 | Cohen | |
| 6,567,262 B2 | 5/2003 | Meir | |
| 6,725,682 B2 * | 4/2004 | Scott | 62/259.2 |
| 6,726,505 B2 | 4/2004 | Cermak, III et al. | |
| 6,837,063 B1 | 1/2005 | Hood, III et al. | |
| 6,845,622 B2 | 1/2005 | Sauciuc et al. | |
| 6,917,522 B1 | 7/2005 | Erturk et al. | |
| 6,956,740 B2 | 10/2005 | Shimura et al. | |
| 6,971,243 B2 | 12/2005 | Scott | |
| 7,034,223 B2 | 4/2006 | Fan et al. | |

(Continued)

FOREIGN PATENT DOCUMENTS

EP    1 684 031 A2    7/2006
GB    2 322 732 A1    2/1998

OTHER PUBLICATIONS

"H2Ceramic Cooling: a Two-Stage Liquid/TEC Hybrid Cooling System for Over-Clocked CPUs," Wayne Caswell et al., Dell, Inc. White Paper, Oct. 2006.

(Continued)

*Primary Examiner* — Frantz Jules
*Assistant Examiner* — Cassey D Bauer
(74) *Attorney, Agent, or Firm* — Larson Newman, LLP

(57) ABSTRACT

A thermoelectric cooler assembly comprises a cold plate, a first thermoelectric cooler, and a second thermoelectric cooler. The cold plate has a first side and a second side. The first thermoelectric cooler is in thermal communication with the first side of the cold plate, and the second thermoelectric cooler is in thermal communication with the second side of the cold plate. A heat exchanger assembly is also disclosed.

14 Claims, 2 Drawing Sheets

U.S. PATENT DOCUMENTS

| | | |
|---|---|---|
| 7,042,727 B2 | 5/2006 | Ulen et al. |
| 7,227,761 B2 | 6/2007 | Estes et al. |
| 2003/0175091 A1 | 9/2003 | Aukzemas et al. |
| 2003/0188538 A1* | 10/2003 | Chu et al. ............... 62/3.2 |
| 2005/0068737 A1 | 3/2005 | Leija et al. |
| 2005/0122690 A1 | 6/2005 | Hood, III et al. |
| 2005/0146850 A1* | 7/2005 | Meir ............... 361/687 |
| 2006/0005948 A1 | 1/2006 | Sauciuc et al. |
| 2006/0082971 A1 | 4/2006 | Artman et al. |
| 2006/0096737 A1 | 5/2006 | Kimura |
| 2006/0166030 A1 | 7/2006 | Suzuki et al. |
| 2008/0100521 A1 | 5/2008 | Herbert et al. |

OTHER PUBLICATIONS

"Overclocking," Wayne Caswell, Dell, Inc. White Paper, Oct. 2006.

* cited by examiner

HYBRID HEAT EXCHANGER

FIELD OF THE DISCLOSURE

This disclosure relates generally to information handling systems, and relates more particularly to a two stage thermoelectric cooler-enhanced heat exchanger having liquid cooling.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems include processors, which produce heat. In information handling systems such as desktop computers, the heat produced by the processors is typically managed with air cooling. However, air cooling has inherent limitations that may be exceeded by microprocessors that are increasingly dense and powerful. Thermoelectric coolers (TEC) to improve thermal performance have therefore been proposed. U.S. Patent Application Publication No. 2006/0082971, the disclosure of which is hereby incorporated by reference, shows a system and method for heat dissipation including a TEC.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

Figure 1:
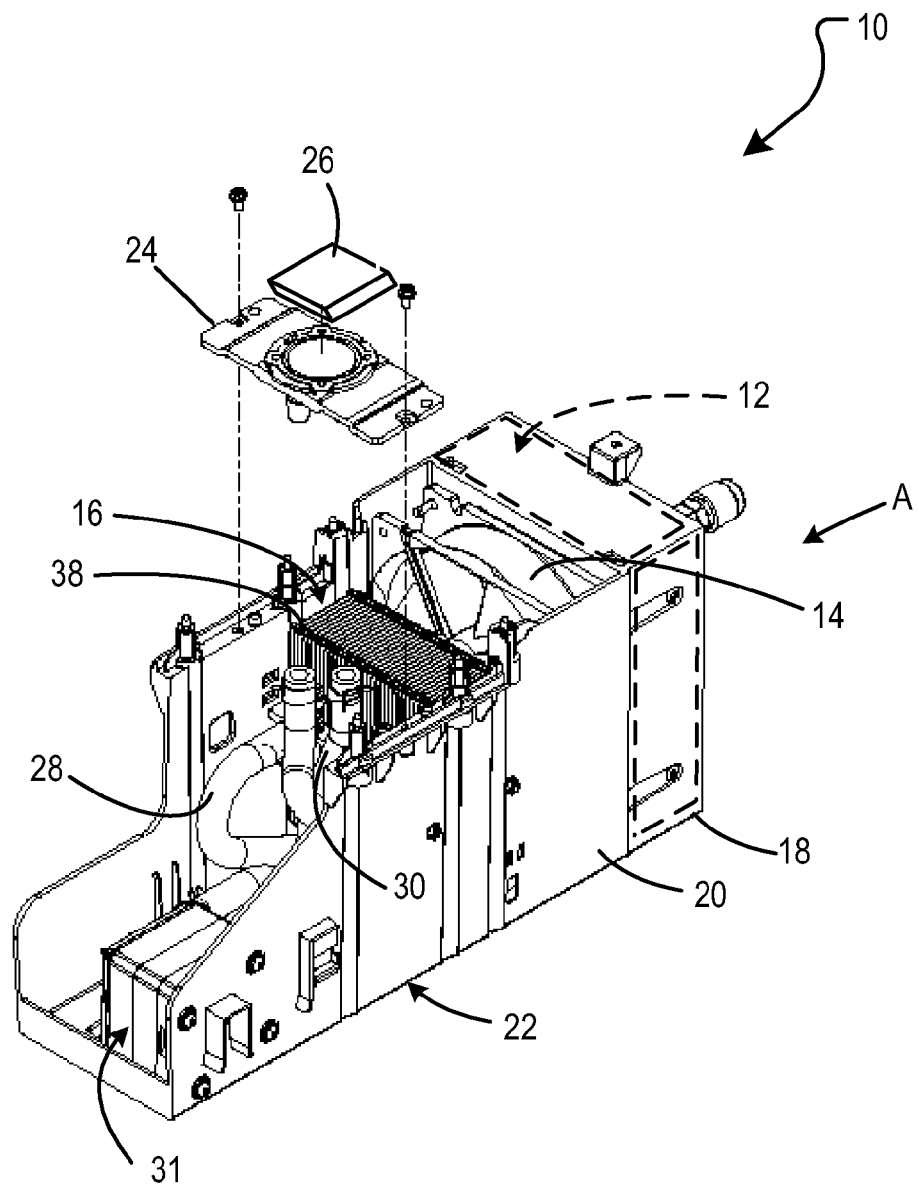
FIG. 1 is a partially exploded perspective view of a hybrid heat exchanger.

FIG. 1 shows a hybrid heat exchanger 10 for an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The hybrid heat exchanger 10 includes a passive heat exchanger or radiator 12, a fan 14 and a thermoelectric cooler (TEC) assembly 16. The radiator 12 is preferably disposed in a shroud 18, while the fan 14 and the TEC assembly 16 are disposed in a subassembly 20. The shroud 18 and the subassembly 20 together form a module 22. A micro-channel cold plate 24 is also disposed within the subassembly 20, and is adapted for physical and/or thermal communication with the CPU 26 (shown schematically). The micro-channel cold plate 24 is also adapted for fluid communication with a pair of conduits 28 and 30. A pump 31 circulates liquid coolant, such as water, to and/or from the radiator 12 and through the conduits 28 and 30 in well-known fashion.

Figure 2:
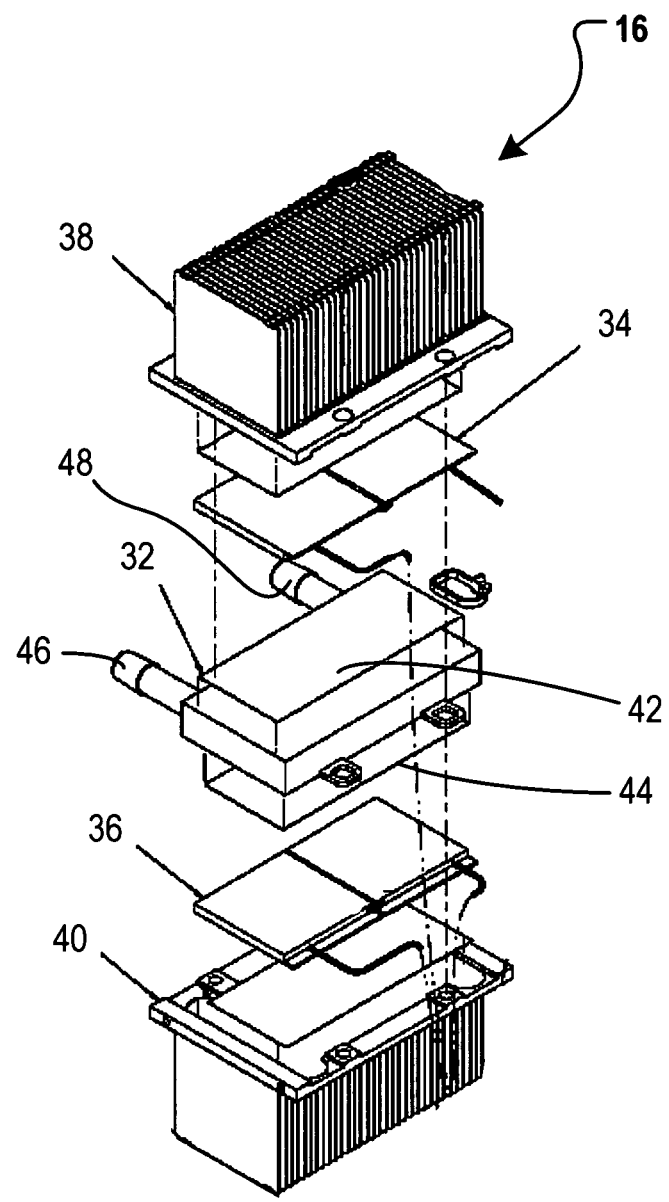
FIG. 2 is an exploded perspective view of a thermoelectric cooler of the hybrid heat exchanger.

FIG. 2 shows the TEC assembly 16 including a two-sided fluid heat exchanger or cold plate 32, an upper TEC 34, a lower TEC 36, an upper heat sink 38, and a lower heat sink 40. The cold plate 32 includes opposite surfaces 42 and 44, as well as conduits 46 and 48 through which coolant is circulated by the pump 31. The upper TEC 34 is disposed between the upper surface 42 of the cold plate 32 and the lower side of the upper heat sink 38. Similarly, the lower TEC 36 is disposed between the lower surface 44 of the cold plate 32 and the upper side of the lower heat sink 40.

Referring again to FIG. 1, the fan 14 draws air inwardly in the direction of arrow A through the radiator 12. The temperature of the coolant circulated by the pump 31 is thereby lowered, and the ambient temperature of the incoming airflow is correspondingly raised as it is drawn into the subassembly 20. The airflow is thereafter directed by the fan 14 through the TEC assembly 16 where it picks up heat from the fins of the heat sinks 38 and 40.

The hybrid heat exchanger 10 can be operated without power to the TECs 34 and 36. To obtain additional performance, various levels of power can be supplied to one or both of the TECs 34 and 36. Under power, the flow of current through the TECs creates a decrease in temperature at the region near the cold plate surfaces 42 and/or 44, which in turn draws heat from the fluid circulating through the cold plate 32. This heat is then transported through the TECs 34 and 36 to the bases of the upper and lower heat sinks 38 and 40, respectively, and finally is radiated out through the fins of the heat sinks With power applied to the TECs 34 and 36, the fluid temperature can be maintained in a range centered about three degrees Centigrade above the ambient air temperature with very high CPU power and reasonably low fan speed. Also, because the temperature of the TEC fins is in a range centered about fifteen to twenty degrees Centigrade above the fluid temperature, the TEC fins are efficient at transferring heat to the pre-heated airstream.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A heat exchanger assembly comprising:
a passive heat exchanger;
an active heat exchanger; and
a fan adapted to draw air through the passive heat exchanger and to blow air through the active heat exchanger.

2. The assembly of claim 1, wherein the passive heat exchanger comprises a radiator.

3. The assembly of claim 1, wherein the active heat exchanger comprises a cold plate having a first side and a second side.

4. The assembly of claim 3, wherein the active heat exchanger further comprises a first thermoelectric cooler in thermal communication with the first side of the cold plate, and a second thermoelectric cooler in thermal communication with the second side of the cold plate.

5. The assembly of claim 4, further comprising a first heat sink in thermal communication with the first thermoelectric cooler.

6. The assembly of claim 5, further comprising a second heat sink in thermal communication with the second thermoelectric cooler.

7. The assembly of claim 3, wherein coolant circulates through the cold plate.

8. The assembly of claim 3, further comprising a pump for circulating coolant through the cold plate.

9. A heat exchanger assembly comprising:
a passive heat exchanger;
an active heat exchanger;
a fan adapted to draw air through the passive heat exchanger and to blow air through the active heat exchanger; and
a pump for circulating coolant through the active heat exchanger.

10. The assembly of claim 9, wherein the passive heat exchanger comprises a radiator.

11. The assembly of claim 9, wherein the active heat exchanger comprises a cold plate having a first side and a second side.

12. The assembly of claim 11, wherein the active heat exchanger further comprises a first thermoelectric cooler in thermal communication with the first side of the cold plate, and a second thermoelectric cooler in thermal communication with the second side of the cold plate.

13. The assembly of claim 12, further comprising a first heat sink in thermal communication with the first thermoelectric cooler.

14. The assembly of claim 13, further comprising a second heat sink in thermal communication with the second thermoelectric cooler.

* * * * *